(12) United States Patent
Reinberg

(10) Patent No.: US 6,509,626 B2
(45) Date of Patent: Jan. 21, 2003

(54) CONDUCTIVE DEVICE COMPONENTS OF DIFFERENT BASE WIDTHS FORMED FROM A COMMON CONDUCTIVE LAYER

(76) Inventor: Alan R. Reinberg, 6 Terhune Dr., Westport, CT (US) 06880

( * ) Notice: Subject to any disclaimer, the term of this patent is extended or adjusted under 35 U.S.C. 154(b) by 0 days.

(21) Appl. No.: 09/864,559

(22) Filed: May 23, 2001

(65) Prior Publication Data

US 2001/0048138 A1 Dec. 6, 2001

Related U.S. Application Data

(62) Division of application No. 09/579,538, filed on May 24, 2000, now Pat. No. 6,277,704.

(51) Int. Cl.$^7$ ............................................. H01L 29/06
(52) U.S. Cl. ...................... 257/623; 438/412; 438/944
(58) Field of Search .......................... 216/46; 257/623; 438/412, 531, 944, 978

(56) References Cited

U.S. PATENT DOCUMENTS

| 4,597,826 A | * | 7/1986 | Majima et al. ................ 216/46 |
| 4,648,937 A | * | 3/1987 | Ogura et al. ................. 438/702 |
| 4,707,218 A | * | 11/1987 | Giammarco et al. ........ 438/421 |
| 4,857,477 A | * | 8/1989 | Kanamori ................... 438/386 |
| 4,931,137 A | * | 6/1990 | Sibuet .......................... 216/13 |
| 5,618,383 A | * | 4/1997 | Randall ....................... 430/314 |
| 5,795,830 A | * | 8/1998 | Cronin et al. ............... 438/696 |
| 5,895,740 A | * | 4/1999 | Chien et al. ................. 430/313 |
| 6,103,596 A | * | 8/2000 | Peng ............................ 438/439 |
| 6,103,613 A |   | 8/2000 | Akram ........................ 438/597 |
| 6,140,227 A |   | 10/2000 | Chen et al. .................. 438/644 |
| 6,211,051 B1 |  | 4/2001 | Jurgensen et al. ........... 438/597 |
| 6,232,229 B1 |  | 5/2001 | Reinberg ..................... 438/669 |
| 6,242,321 B1 | * | 6/2001 | Acosta et al. ................ 438/424 |

* cited by examiner

*Primary Examiner*—Richard Elms
*Assistant Examiner*—Christian D. Wilson

(57) ABSTRACT

A microelectronic device fabricating method includes providing a substrate having a mean global outer surface extending along a plane. A first portion is formed over the substrate comprising a straight linear segment which is angled from the plane and forming a second portion over the substrate comprising a straight linear segment which is angled from the plane at a different angle than the first portion. A layer of structural material is formed over the first and second portions. The structural material layer is anisotropically etched and a first device feature is ultimately left over the first portion having a first base width and a second device feature is ultimately left over the second portion having a second base width which is different from the first base width. Integrated circuitry includes a substrate having a mean global outer surface extending along a plane. The substrate includes a first conductive device component of a first type which is elongated in a first direction generally parallel with the plane. A second conductive device component of the first type is included which is elongated in a second direction generally parallel with the plane, with the first and second conductive device components at least predominately comprise common conductive material. The first and second conductive device components have different base widths. At least one of the first and second conductive device components is elevationally angled from perpendicular to the plane along at least a majority of its elongated length in its respective first or second direction.

27 Claims, 6 Drawing Sheets

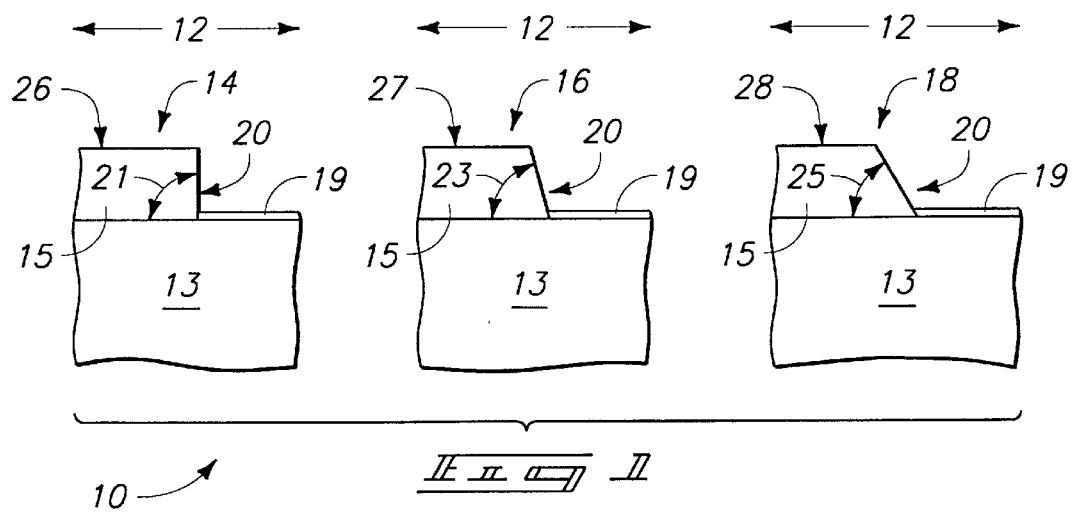
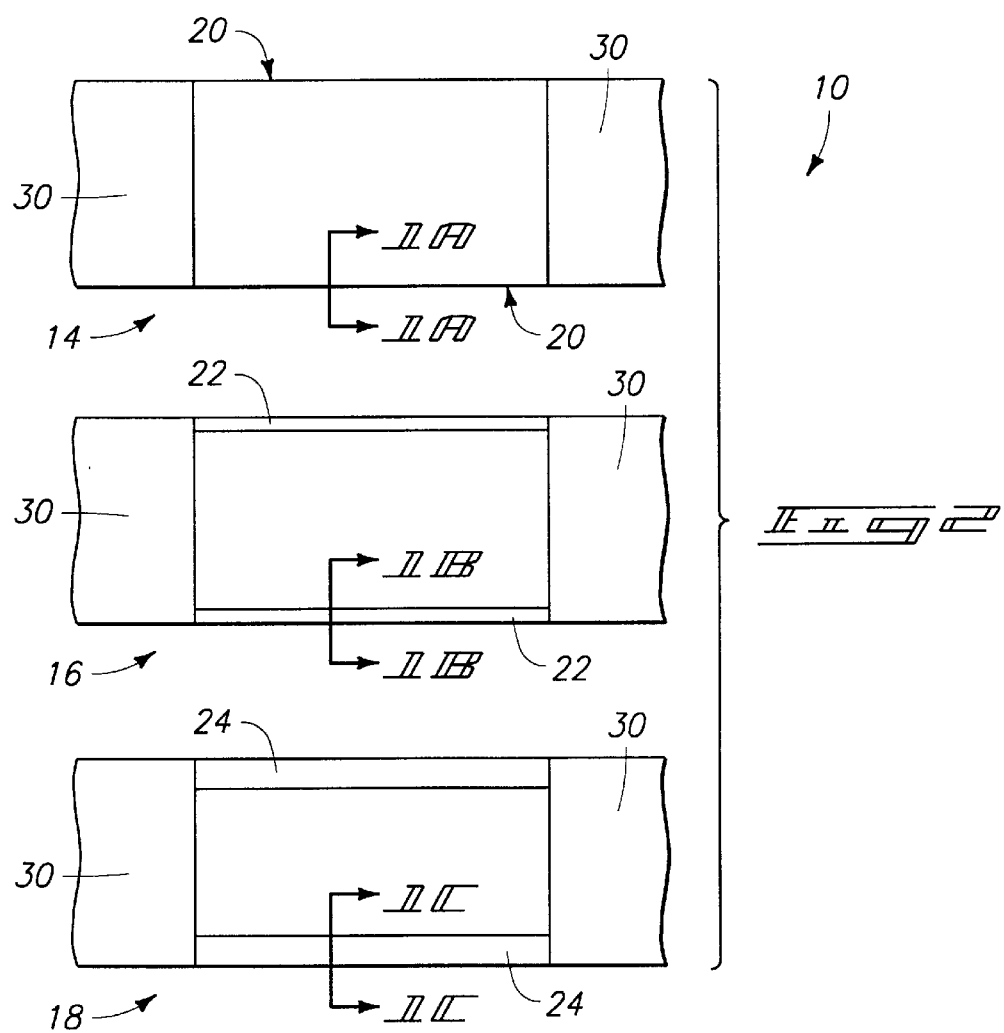

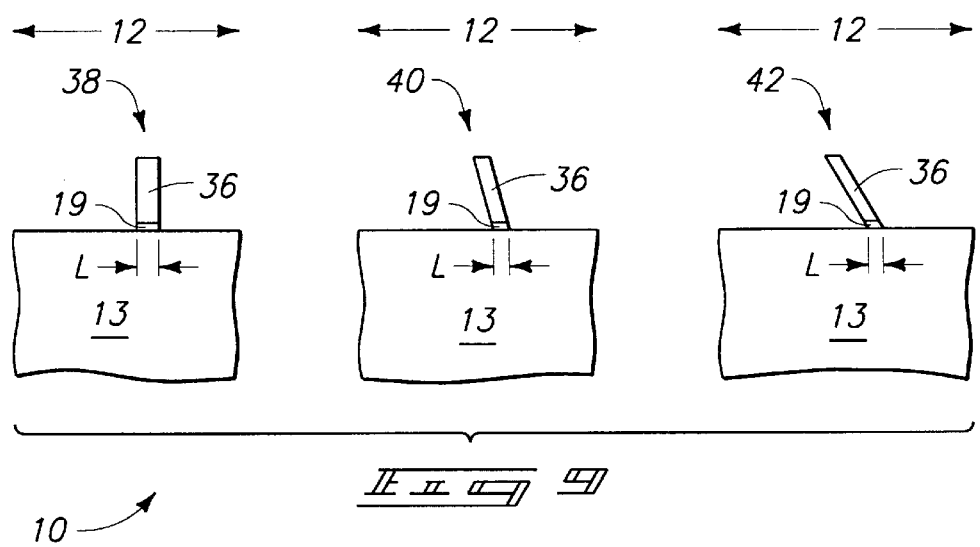
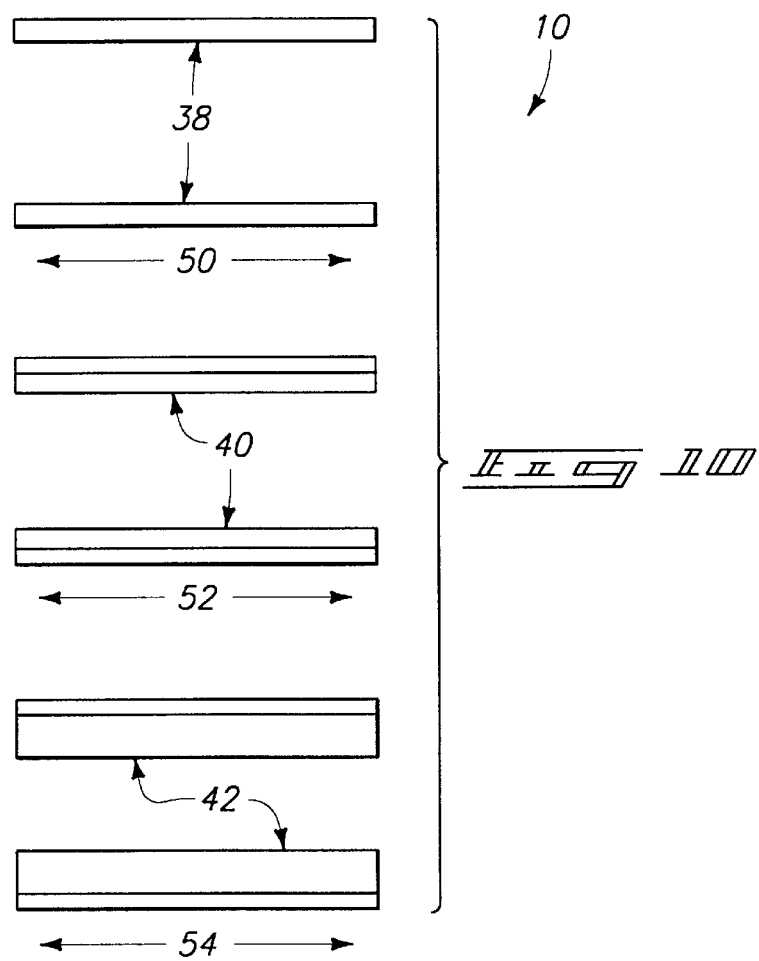

CONDUCTIVE DEVICE COMPONENTS OF DIFFERENT BASE WIDTHS FORMED FROM A COMMON CONDUCTIVE LAYER

RELATED PATENT DATA

This patent resulted from a divisional application of U.S. patent application Ser. No. 09/579,538, filed on May 24, 2000 now U.S. Pat. No. 6,277,704.

TECHNICAL FIELD

This invention relates to microelectronic device fabricating methods, to methods of forming a pair of conductive device components of different base widths from a common deposited conductive layer, and to integrated circuitry.

BACKGROUND OF THE INVENTION

Integrated circuitry fabrication typically involves lithographic processing whereby a desired circuitry image is formed in an imaging layer. The image is transferred to underlying circuitry layers on a substrate by using the imaging layer as a mask during etching or other removal of underlying material exposed through the imaging layer. Further, in many instances it is desirable to form the same type of devices from a commonly deposited conductive layer to have different dimensions, including having different base widths of such devices.

Integrated circuitry fabricators are ever attempting to increase circuitry density and thereby reduce the size of individual conductive components. As device dimensions decrease, interest is increasing in using alternatives to lithographic definition of features, particularly in an effort to achieve device dimensions that are smaller than the available, yet ever decreasing, minimum feature resolution using lithography.

Various vertical device structures are under investigations that make use of controlled deposition as a means of creating small features, with the base width dimension thereby being controlled largely by the deposition thickness of the layer. For example, it is possible to deposit conductive material over a vertical wall to a known desired thickness, and then remove it from horizontal surfaces by anisotropic reactive ion etching. This leaves a vertically extending conductive component having a base width essentially equal to the deposition thickness of the conductive layer. Such techniques have historically also been utilized to form insulative spacers over field effect transistor lines.

It would be desirable, although not required, to develop improved methods which enable both subresolution processing and fabrication of multiple width electronic device components using presently and yet-to-be-developed photolithographic and other masking processing.

SUMMARY

The invention includes microelectronic device fabricating methods, methods of forming a pair of conductive device components of different base widths from a common deposited conductive layer, and integrated circuitry. In one implementation, a microelectronic device fabricating method includes providing a substrate having a mean global outer surface extending along a plane. A first portion is formed over the substrate comprising a straight linear segment which is angled from the plane and forming a second portion over the substrate comprising a straight linear segment which is angled from the plane at a different angle than the first portion. A layer of structural material is formed over the first and second portions. The structural material layer is anisotropically etched and a first device feature is ultimately left over the first portion having a first base width and a second device feature is ultimately left over the second portion having a second base width which is different from the first base width.

In one implementation, integrated circuitry includes a substrate having a mean global outer surface extending along a plane. The substrate includes a first conductive device component of a first type and which is elongated in a first direction generally parallel with the plane. A second conductive device component of the first type is included which is elongated in a second direction generally parallel with the plane, with the first and second conductive device components at least predominately comprise common conductive material. The first and second conductive device components have different base widths. At least one of the first and second conductive device components is elevationally angled from perpendicular to the plane along at least a majority of its elongated length in its respective first or second direction.

BRIEF DESCRIPTION OF THE DRAWINGS

Preferred embodiments of the invention are described below with reference to the following accompanying drawings.

FIG. 1 is a diagrammatic fragmentary view of multiple sections of a semiconductor substrate in process in accordance with an aspect of the invention.

FIG. 2 is a diagrammatic top view of FIG. 1.

FIG. 9 is a view of the FIG. 1 wafer fragments at a processing step subsequent to that depicted by FIG. 7.

FIG. 10 is a diagrammatic top view of FIG. 9.

DETAILED DESCRIPTION OF THE PREFERRED EMBODIMENTS

Figure 3:
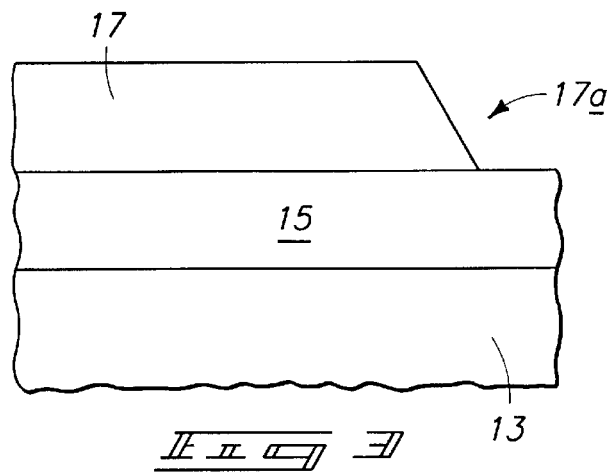
FIG. 3 is a diagrammatic sectional view of a precursor construction to the far right fragmentary portion of FIG. 1.

This disclosure of the invention is submitted in furtherance of the constitutional purposes of the U.S. Patent Laws "to promote the progress of science and useful arts" (Article 1, Section 8).

Referring to FIGS. 1 and 2, a semiconductor wafer fragment in process is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Further in the context of this document, the term "layer" encompasses both the singular and the plural. Substrate 10 as depicted comprises a bulk monocrystalline silicon substrate 13.

Three exemplary fragmentary sections of the substrate are shown in FIGS. 1 and 2. The left illustrated view in FIG. 1 is taken through line 1A—1A of FIG. 2; the middle view in FIG. 1 is taken through line 1B—1B in FIG. 2, and the right view in FIG. 1 is taken through line 1C—C in FIG. 2. The exemplary substrate is depicted in FIG. 1 as having an outer topography which is not planar. However nevertheless, the substrate can be considered as having some mean global outer surface extending along a plane 12. In other words, the substrate, typically in the form of a semiconductor wafer fragment, at the micro level, may or may not have a nonplanar outer topography, but can be considered as having a planar mean global outer surface when viewing the substrate/wafer as a whole.

A deposited material 15 is used to form a first portion 14, a second portion 16 and a third portion 18 are formed over substrate 13. Such are preferably formed to comprise first, second and third mandrils which will be utilized to provide structural features, preferably conductive structural features, of varying base width from one commonly deposited layer. The discussion proceeds with reference to a preferred implementation wherein common conductive device components in the form of field effect transistor gate lines are being fabricated. Accordingly, a gate dielectric layer 19 is shown as being formed over exposed regions of substrate 13, and after fabrication of portions 14, 16 and 18. Alternately and by way of example only, gate dielectric layer 19, or other layers, could be fabricated prior to formation of portions/mandrils 14, 16 and 18. Further, mandrils 14, 16 and 18 are illustrated as being formed as discrete portions, although interconnection of the same is also contemplated, although not preferred.

First portion or mandril 14 comprises some substantially straight linear segment 20 which is angled from plane 12 by an angle 21. In the exemplary illustrated embodiment, angle 21 is a right angle. Second portion 16 comprises some substantially straight linear segment 22 which is angled from plane 12 at a different angle 23 than first portion angle 21. In the exemplary illustrated embodiment, angle 23 is 75°. Third portion 18 comprises some substantially straight linear segment 24 which is angled from plane 12 at a different angle than angles 21 and angle 23, at an angle 25. In the illustrated exemplary embodiment, angle 25 is 60°. In the illustrated and preferred embodiments, substrate 13 comprises an outer surface which is generally planar and parallel with plane 12 and over which mandrils 14, 16, 18 and gate dielectric layer 19 lie. Further in the illustrated and preferred embodiments, mandrils 14, 16 and 18 comprise respective outermost surface portions 26, 27 and 28, respectively, which are planar and parallel with plane 12. Other embodiments are, of course, contemplated whereby such sections are not necessarily straight linear and, regardless, not necessarily parallel with plane 12.

Further in the illustrated and preferred embodiments, each of substantially straight linear segments 20, 22 and 24 extends entirely between and to outermost surface portions 26, 27 and 28, respectively, and to innermost surface portions of mandrils 14, 16 and 18, respectively, overlying substrate 13. Alternate embodiments are, of course, contemplated whereby some substantially straight linear segment occurs somewhere between outermost and innermost surfaces of portion/mandrils 14, 16 and 18 without extending entirely therebetween. In the context of this patent, "substantially straight linear" means a perfectly straight segment as well as a segment that has a degree of curvature associated with it. A curved segment is to be considered "substantially straight linear" in the context of this patent provided that it has some chord length greater than or equal to 30 nanometers and has some radius of curvature of at least 20 nanometers.

In the illustrated exemplary embodiment, straight linear segment 20 is perpendicular to plane 12, wherein straight linear segments 22 and 24 are not and are bevelled relative to such plane. Further, when considering, for example, linear segment 20 as constituting a first linear segment and linear segment 24 as constituting a second linear segment, only one of such linear segments (segment 24) is bevelled relative to plane 12.

Material 15 of mandrils 14, 16 and 18 might be electrically conductive, semiconductive or electrically insulative. Example techniques whereby such mandrils might be formed, and preferably at the same time, are as disclosed and described in co-pending U.S. patent application Ser. No. 09/444,280, filed on Nov. 19, 1999, entitled "Microelectronic Device Fabricating Method, Integrated Circuitry, and Intermediate Construction", listing Alan R. Reinberg as the inventor, and which is fully incorporated by reference herein. Exemplary mandrils 14, 16 and 18 are preferably processed to have end sections 30 (FIG. 2) having an angle slope which is no more than 20° upward from horizontal to facilitate complete end removal of conductive or other device components being fabricated without utilizing any additional or subsequent masking, as described in the Ser. No. 09/444,280 application. For example, FIG. 3 depicts the far right portion of the wafer fragment of FIG. 1 at a processing step just prior to that of FIG. 1. Such shows layer 15 from which portion 18 of FIG. 1 will be made. A photoresist layer 17 overlies layer 15, and has a beveled edge 17a substantially equal to what will be the bevel angle 25 of segment 20 of portion 18, assuming substantially equal etch rates of the photoresist and material therebeneath. Such resist pattern is thereafter transferred by etching to form portion 18 of FIG. 1 from layer 15 of FIG. 3. Transfer of such a resist profile to an underlying substrate may be performed according to any suitable method known to those skilled in the art at present or later developed. In one such method, transferring the profile of resist mask pattern 17 to material 15 can be accomplished by an etch process that etches both materials. Reactive ion etch processes are capable of such an etch. If resist mask pattern 17 and material 15 are etched at approximately the same rate, then the profile produced in material 15 will substantially match the profile of resist mask pattern 17, producing the far right FIG. 1 construction. As etch selectivity to material 15 increases, the effectiveness of the profile transfer tends to decrease. If an etch affects material 15 exclusively, then it is unlikely that beveled portion 17a of resist mask pattern 17 will transfer to material 15. Transfer of a resist bevel to an underlying layer can be described by the expression: tan (resist bevel)/tan(substrate bevel)=etch rate$_{resist}$/etch rate$_{substrate}$.

Figure 4:
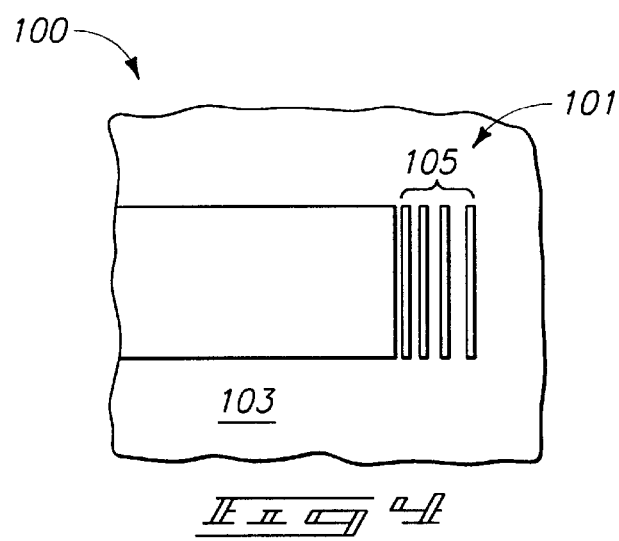
FIGS. 4 and 5 are diagrammatic top views of exemplary exposure masks usable to form the FIG. 3 construction.

FIG. 4 illustrates an exposure mask 100 including a blocking shape 101 positioned within a transparent region 103. Blocking shape 101 includes a graded portion 105 for exposing a resist to actinic energy providing gradated exposure. That is, graded portion 105 includes alternating blocking shapes and transparent regions spaced and otherwise positioned such that exposure intensity is increased at an edge of blocking shape 101 compared to the center of blocking shape 101. The advantage of blocking shape 101 is that exposure intensity to actinic radiation may be gradually increased over a desired distance such that gradated exposure of a resist region occurs.

Figure 5:
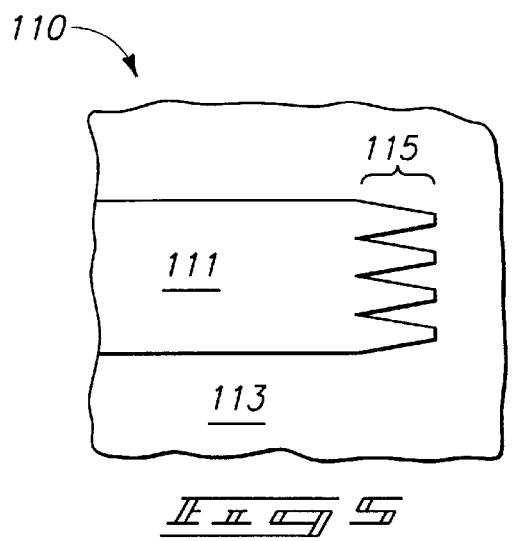

FIG. 5 illustrates an exposure mask 110. Wafer portion 110 similarly includes blocking shape 111 positioned within a transparent region 113 and having a graded portion 115. Although different in structure from graded portion 105, graded portion 115 provides similar advantages. Alternatively, an otherwise solid blocking shape (not shown) could include openings formed therein of a designated size and positioned to accomplish similar advantages. A variety of other structures, devices, and exposure methods may be used to provide gradated exposure of a resist to actinic energy, whether currently known to those skilled in the art or later developed.

Figure 6:
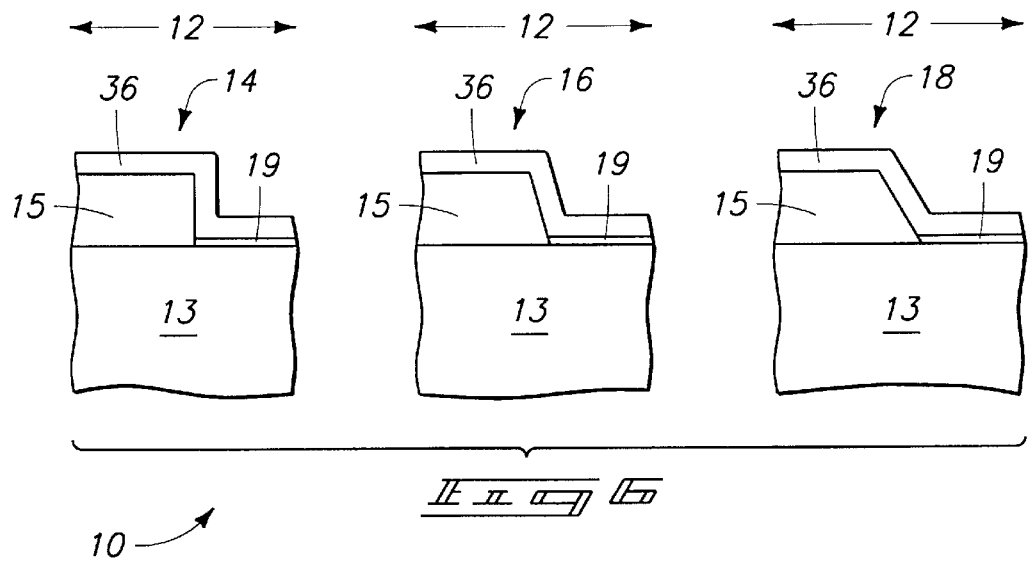
FIG. 6 is a view of the FIG. 1 wafer fragments at a processing step subsequent to that depicted by FIG. 1.

Referring to FIG. 6, a layer 36 of structural material is formed over the substrate and accordingly first, second and third mandrils 14, 16 and 18. The material of layer 36 might be electrically conductive, semiconductive as deposited or later provided, or electrically insulative. Further, such layer might be deposited to constitute a single homogenous layer or multiple discrete layers. In the depicted preferred embodiment, layer 36 is deposited to constitute electrically conductive material for fabrication of a conductive gate, preferably in the form of heavily doped conductive polysilicon alone or in combination with other conductive material.

Figure 7:
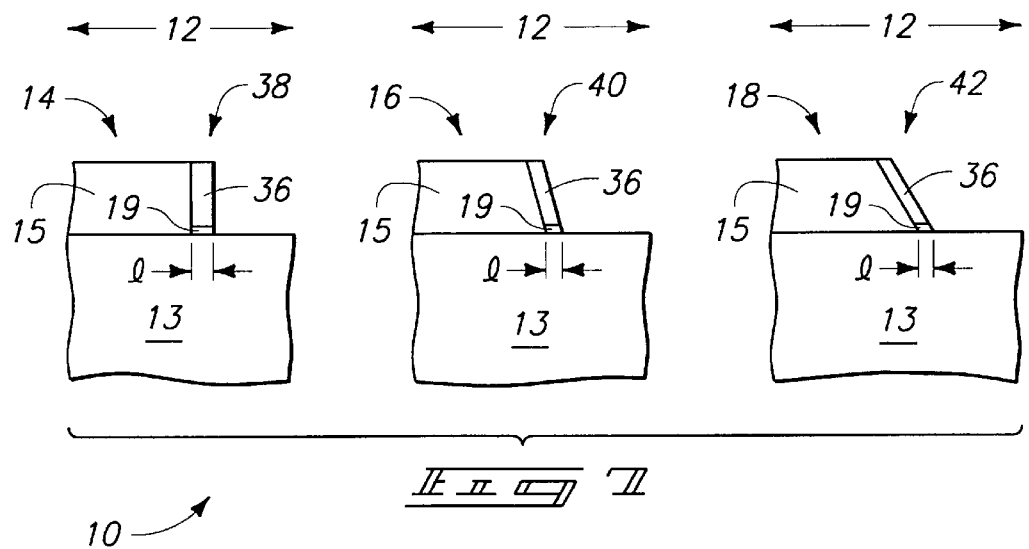
FIG. 7 is a view of the FIG. 1 wafer fragments at a processing step subsequent to that depicted by FIG. 6.

Referring to FIG. 7, structural material layer 36 has been anisotropically etched and ultimately leaving device features 38, 40 and 42 over first, second and third portions 14, 16 and 18, respectively. Each has different base widths "1" from one another. Such is preferably achieved relative to controlled anisotropic etching due to the variable angles 21, 23 and 25 of the respective linear segments. For example, an aspect of the invention contemplates utilization of anisotropic etching to substantially remove material completely from horizontal or low angle surfaces while leaving material on vertical and higher angled surfaces. For surfaces that are neither vertical nor horizontal, but are inclined at some angle, the etching proceeds at a rate between that on the horizontal surfaces and that on the vertical surfaces. Etching can be conducted, preferably with ion-assisted etching, where the etch rate on sloped material is related to the angle that the material makes with incoming ions. Assuming that the etch rate of a sloped surface in the direction along that of the incident ions is substantially the same as that on horizontal surfaces, the amount of material removed can be calculated as follows. If etching proceeds just to the point that material is removed from horizontal surfaces, then "1" the width of the intersection of material on a sloping wall with a horizontal surface at the bottom can be given by:

$$L/t = 1/\sin(a) - \cot(a)$$

where "t" is the initial thickness of the deposited film largely assumed to be uniform on all surfaces, and "a" is the angle by which the linear segment slopes.

Figure 8B:
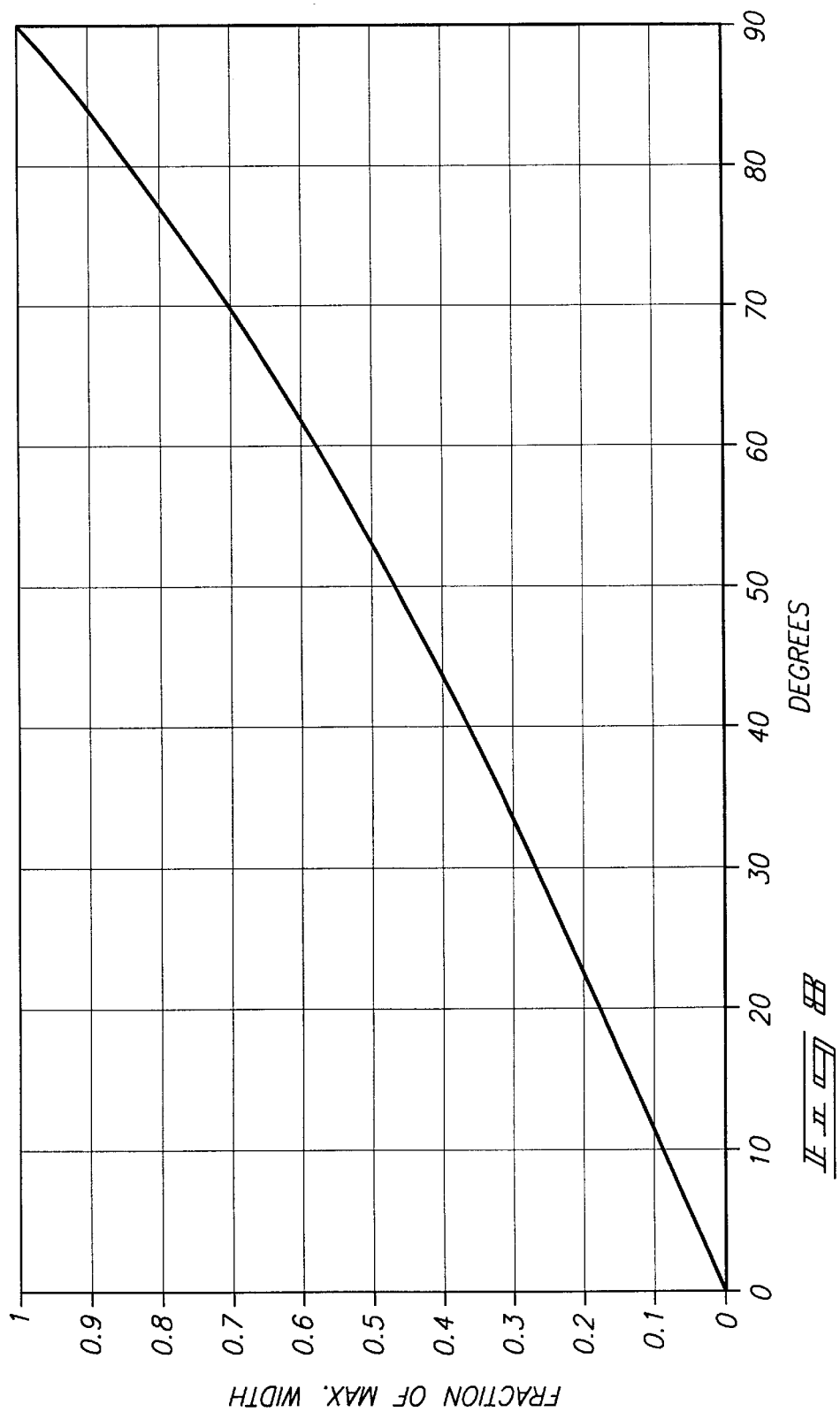
FIG. 8 is a graphical representation utilizable in accordance with an aspect of the invention.

FIG. 8, in a simplified manner, plots this function which is shown to be a largely linear relationship. Accordingly, if sloped linear segments of various slope angle and perpendicular walls are simultaneously present on a wafer (i.e., as depicted in the figures), it can be practical to achieve multiple size gate widths/channel lengths "1". As the width of the deposited film thickness can be controlled, typically with considerable accuracy, and can be smaller than that achievable with standard lithographic resolution, it is possible to get multiple width structures simultaneously over a substrate with little or no additional processing steps, for example, as described above relative to the figures in but one preferred embodiment.

FIG. 9 depicts subject device features 38, 40 and 42 in the form of field effect transistor gates. Alternate constructions, such as non-gate interconnect lines, resistors, capacitors, diodes, etc. are also, of course, contemplated.

Figure 11:
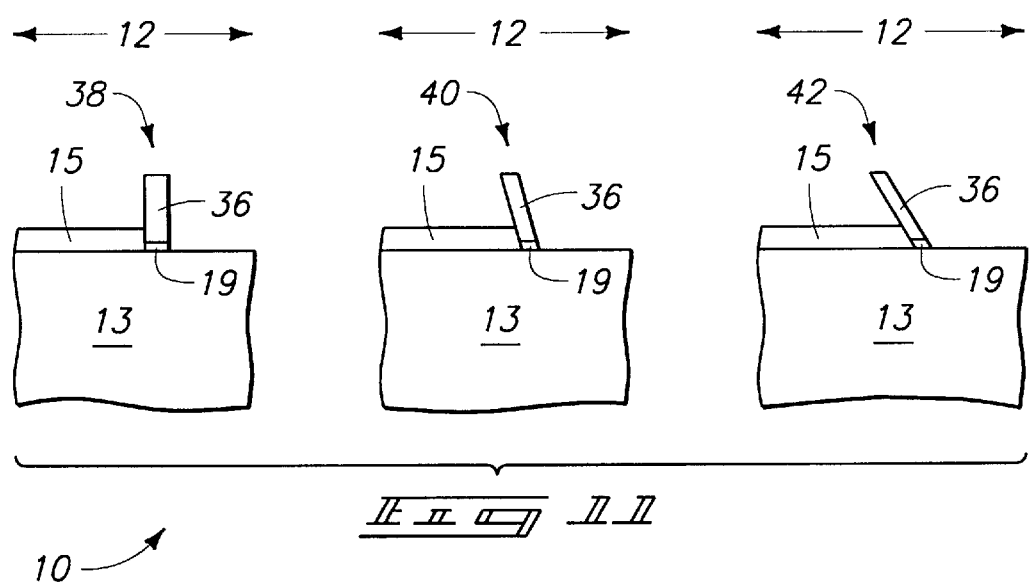
FIG. 11 illustrates alternate exemplary processing to that depicted by FIG. 9.

Preferably, processing in accordance with the invention proceeds by etching at least portions of mandrils 14, 16 and 18 from the substrate. Alternately, all of the mandrils might remain in the finished circuitry. Referring to FIGS. 9 and 10, all of mandrils 14, 16 and 18 of FIG. 7 have been etched from the substrate. Alternate exemplary processing is depicted by FIG. 11 whereby only portions of mandrils 14, 16 and 18 have been etched from the substrate leaving portions of such mandrils as part of the finished circuitry, or to be removed subsequently. The illustrated degree of angling of some of the device components may motivate the fabricator to leave some of the subject mandrils/portions remaining over the substrate to provide elevation holding support to such device components during processing. Alternately if elevational support is an issue, and by way of example only, individual mandrels could be fabricated in accordance with FIG. 6C of the U.S. patent application Ser. No. 09/444,280 referred to above. For example, the mandrils could be fabricated to leave the FIG. 6C illustrated interconnecting cross end pieces, at least initially, to thereby tie the whole structure together around one or more mandrils. Subsequent layer formation would provided desired added elevational holding support for the angled components. Depending upon circuitry requirements, the cross end pieces might then later be removed.

The invention also contemplates integrated circuitry fabricated by the above and other existing or yet-to-be-developed methods. For example, conductive device components 38, 40 and 42 can be considered as first, second and third conductive components of a first type (i.e., field effect transistor gates in the described preferred embodiment). Such conductive device components at least predominately comprise common conductive material (for example, the heavily conductively doped polysilicon as described above). In the depicted cross-section, such conductive device components entirely comprise common conductive material overlying a gate dielectric 19.

First conductive device components 38 are elongated in a first direction 50 which is generally parallel with plane 12, and in the depicted embodiment, perpendicular into and out of the plane of the page with respect to FIG. 9. Second conductive device components 40 are elongated in a second direction 52, generally parallel with plane 12, and in the depicted embodiment, generally perpendicular into and out of the plane of the page with respect to FIG. 9. Third device components 42 are elongated in a third direction 54 generally parallel with plane 12, and in the depicted embodiment, perpendicular into and out of the plane of the page with respect to FIG. 9. In the preferred and depicted embodiments, directions 50, 52 and 54 are parallel with one another, although two or more of the same might not be parallel with one another.

At least two of the conductive device components (i.e., a component 38 and a component 40) have different base widths "1". At least one of such components (i.e., component 40) has a mean elevational axis which is angled from perpendicular to plane 12 along at least a majority of its elongated length in its respective first or second direction (i.e., direction 52). Exemplary components 40 and 42 constitute an example whereby both the first and second conductive device components have respective mean axes which are elevationally angled from perpendicular to plane 12 along at least a majority of their respective lengths in their respective directions. Further in the preferred embodiment and as shown, the first or second conductive device having the lesser angle from the plane has a shorter base width "1" than the first or second conductive device component having the greater angle from the plane. Considering, for example, two device components 38 and 40, only one of such components is elevationally angled from perpendicular to plane 12 along at least a majority of its elongated length in its respective direction (i.e., component device 40 along direction 52).

Source/drain regions for the transistor might be formed in any of a number of different manners. For example, and by way of example only, the structures of FIGS. 1, 6 and/or 7 might be implanted such that source/drain regions are formed in substrate 13 to the right of the illustrated material 36 which ultimately remains in FIG. 7 to form the gate. Layer 15 could be initially deposited or later provided with suitable conductivity enhancing impurity. Thereafter, a suitable anneal could be conducted to drive the impurity into substrate 13 to the left of the illustrated material 36 which ultimately remains in FIG. 7 to form the gate, thereby forming another source/drain region. Further by way of example only, material 15 could be conductively doped semiconductive material at least a portion of which remains behind to form an elevated source/drain.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. Integrated circuitry comprising:
    a substrate having a mean global outer surface extending along a plane;
    the substrate comprising a first conductive device component of a first type and being elongated in a first direction generally parallel with the plane;
    a second conductive device component of the first type and being elongated in a second direction generally parallel with the plane, the first and second conductive device components at least predominately comprising common conductive material and being present as part of a finished construction of the integrated circuitry; and
    the first and second conductive device components having different base widths in the finished circuitry construction, at least one of the first and second conductive device components having a mean elevational axis which is angled from perpendicular to the plane along at least a majority of its elongated length in its respective first or second direction in the finished circuitry construction.

2. The integrated circuitry of claim 1 wherein the first and second directions are parallel with one another.

3. The integrated circuitry of claim 1 wherein the first and second conductive device components entirely comprise common conductive material in at least one cross section.

4. The integrated circuitry of claim 1 wherein both the first and the second conductive device components have a respective mean elevational axis which is elevationally angled from perpendicular to the plane along at least a majority of its elongated length in its respective first or second direction.

5. The integrated circuitry of claim 1 wherein both the first and second conductive device components have mean elevational axes which are differently elevationally angled from the plane, the first or second conductive device component having the lesser angle from the plane having a shorter base width than the first or second conductive device component having the greater angle from the plane.

6. The integrated circuitry of claim 1 wherein only one of the first and the second conductive device components has a mean elevational axis which is angled from perpendicular to the plane.

7. The integrated circuitry of claim 1 wherein the at least one conductive device component has opposing conductive sidewalls comprising respective substantially straight linear segments which are parallel with one another.

8. Integrated circuitry comprising:
    a substrate having a mean global outer surface extending along a plane;
    the substrate comprising a first conductive device component of a first type and being elongated in a first direction generally parallel with the plane;
    a second conductive device component of the first type and being elongated in a second direction generally parallel with the plane, the first and second conductive device components at least predominately comprising common conductive material;
    the first and second conductive device components having different base widths, at least one of the first and second conductive device components having a mean elevational axis which is angled from perpendicular to the plane along at least a majority of its elongated length in its respective first or second direction; and
    wherein the first and second directions are not parallel with one another.

9. The integrated circuitry of claim 8 wherein the first and second conductive device components at least predominately comprising the common conductive material to be present as part of a finished construction of the integrated circuitry, with the first and second conductive device components having different base widths in the finished circuitry construction, with the at least one of the first and second conductive device components mean elevational axis being angled from perpendicular to the plane along at least a majority of its elongated length in its respective first or second direction in the finished circuitry construction.

10. Integrated circuitry comprising:
    a substrate having a mean global outer surface extending along a plane;
    the substrate comprising a first field effect transistor gate and being elongated in a first direction generally parallel with the plane;
    a second field effect transistor gate and being elongated in a second direction generally parallel with the plane, the first and second field effect transistor gates at least predominately comprising common conductive material and being present as part of a finished construction of the integrated circuitry; and
    the first and second field effect transistor gates having different base widths in the finished circuitry construction, at least one of the first and second field effect transistor gates having a mean elevational axis which is angled from perpendicular to the plane along at least a majority of its elongated length in its respective first or second direction in the finished circuitry construction.

11. The integrated circuitry of claim 10 wherein the first and second directions are parallel with one another.

12. The integrated circuitry of claim 10 wherein the first and second field effect transistor gates entirely comprise common conductive material in at least one cross section.

13. The integrated circuitry of claim 10 wherein both the first and the second field effect transistor gates have a respective mean elevational axis which is elevationally angled from perpendicular to the plane along at least a majority of its elongated length in its respective first or second direction.

14. The integrated circuitry of claim 10 wherein both the first and second field effect transistor gates have mean elevational axes which are differently elevationally angled from the plane, the first or second field effect transistor gate having the lesser angle from the plane having a shorter base width than the first or second field effect transistor gate having the greater angle from the plane.

15. The integrated circuitry of claim 10 wherein only one of the first and the second field effect transistor gates has a mean elevational axis which is angled from perpendicular to the plane.

16. The integrated circuitry of claim 10 wherein the at least one field effect transistor gate has opposing conductive sidewalls comprising respective substantially straight linear segments which are parallel with one another.

17. Integrated circuitry comprising:
a substrate having a mean global outer surface extending along a plane;
the substrate comprising a first field effect transistor gate and being elongated in a first direction generally parallel with the plane;
a second field effect transistor gate and being elongated in a second direction generally parallel with the plane, the first and second field effect transistor gates at least predominately comprising common conductive material;
the first and second field effect transistor gates having different base widths, at least one of the first and second field effect transistor gates having a mean elevational axis which is angled from perpendicular to the plane along at least a majority of its elongated length in its respective first or second direction; and
wherein the first and second directions are not parallel with one another.

18. The integrated circuitry of claim 17 wherein the first and second field effect transistors at least predominately comprising the common conductive material to be present as part of a finished construction of the integrated circuitry, with the first and second field effect transistors having different base widths in the finished circuitry construction, with the at least one of the first and second field effect transistors mean elevational axis being angled from perpendicular to the plane along at least a majority of its elongated length in its respective first or second direction in the finished circuitry construction.

19. Integrated circuitry comprising:
a substrate having a mean global outer surface extending along a plane;
the substrate comprising a first conductive device component of a first type having a base and a top of first equal widths, and being elongated in a first direction generally parallel with the plane;
a second conductive device component of the first type having a base and a top of second equal widths, and being elongated in a second direction generally parallel with the plane, the first and second conductive device components at least predominately comprising common conductive material and being present as part of a finished construction of the integrated circuitry; and
the first and second widths being different in the finished circuitry construction, at least one of the first and second conductive device components having a mean elevational axis which is angled from perpendicular to the plane along at least a majority of its elongated length in its respective first or second direction in the finished circuitry construction.

20. The integrated circuitry of claim 19 wherein the first and second directions are parallel with one another.

21. The integrated circuitry of claim 19 wherein the first and second conductive device components entirely comprise common conductive material in at least one cross section.

22. The integrated circuitry of claim 19 wherein both the first and the second conductive device components have a respective mean elevational axis which is elevationally angled from perpendicular to the plane along at least a majority of its elongated length in its respective first or second direction.

23. The integrated circuitry of claim 19 wherein both the first and second conductive device components have mean elevational axes which are differently elevationally angled from the plane, the first or second conductive device component having the lesser angle from the plane having a shorter base width than the first or second conductive device component having the greater angle from the plane.

24. The integrated circuitry of claim 19 wherein only one of the first and the second conductive device components has a mean elevational axis which is angled from perpendicular to the plane.

25. The integrated circuitry of claim 19 wherein the at least one conductive device component has opposing conductive sidewalls comprising respective substantially straight linear segments which are parallel with one another.

26. Integrated circuitry comprising:
a substrate having a mean global outer surface extending along a plane;
the substrate comprising a first conductive device component of a first type having a base and a top of first equal widths, and being elongated in a first direction generally parallel with the plane;
a second conductive device component of the first type having a base and a top of second equal widths, and being elongated in a second direction generally parallel with the plane, the first and second conductive device components at least predominately comprising common conductive material;
the first and second widths being different, at least one of the first and second conductive device components having a mean elevational axis which is angled from perpendicular to the plane along at least a majority of its elongated length in its respective first or second direction; and
wherein the first and second directions are not parallel with one another.

27. The integrated circuitry of claim 26 wherein the first and second conductive device components at least predominately comprising the common conductive material to be present as part of a finished construction of the integrated circuitry, with the first and second conductive device components having different base widths in the finished circuitry construction, with the at least one of the first and second conductive device components mean elevational axis being angled from perpendicular to the plane along at least a majority of its elongated length in its respective first or second direction in the finished circuitry construction.

* * * * *

UNITED STATES PATENT AND TRADEMARK OFFICE
CERTIFICATE OF CORRECTION

PATENT NO.     : 6,509,626 B2
DATED          : January 21, 2003
INVENTOR(S)    : Alan R. Reinberg It is certified that error appears in the above-identified patent and that said Letters Patent is hereby corrected as shown below:

<u>Title page, Item [54] and Column 1, lines 1-3,</u>
Replace "CONDUCTIVE DEVICE COMPONENTS OF DIFFERENT BASE WIDTHS FORMED FROM A COMMON CONDUCTIVE LAYER" with
-- CONDUCTIVE DEVICE COMPONENTS OF DIFFERENT BASE WIDTHS FORMED FROM A COMMON CONDUCTIVE MATERIAL --

Signed and Sealed this

Fifth Day of August, 2003

JAMES E. ROGAN
*Director of the United States Patent and Trademark Office*